(12) United States Patent
Kothandaraman et al.

(10) Patent No.: US 7,391,097 B2
(45) Date of Patent: Jun. 24, 2008

(54) SECURE ELECTRICALLY PROGRAMMABLE FUSE

(75) Inventors: Chandrasekharan Kothandaraman, Hopewell Junction, NY (US); Subramanian S. Iyer, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 419 days.

(21) Appl. No.: 11/160,151

(22) Filed: Jun. 10, 2005

(65) Prior Publication Data

US 2006/0278932 A1    Dec. 14, 2006

(51) Int. Cl.
  *H01L 29/06* (2006.01)
(52) U.S. Cl. ................. 257/529; 257/209; 257/E23.149; 438/132
(58) Field of Classification Search .......... 257/E23.149, 257/209, 529
See application file for complete search history.

(56) References Cited

U.S. PATENT DOCUMENTS

| | | | |
|---|---|---|---|
| 5,264,725 A | | 11/1993 | Mullarkey et al. |
| 5,303,402 A | | 4/1994 | McLaughlin et al. |
| 5,536,968 A | | 7/1996 | Crafts et al. |
| 5,622,892 A | * | 4/1997 | Bezama et al. ............. 438/601 |
| 5,708,291 A | | 1/1998 | Bohr et al. |
| 5,872,390 A | | 2/1999 | Lee et al. |
| 5,970,346 A | | 10/1999 | Liaw |
| 6,008,075 A | | 12/1999 | Lien et al. |
| 6,033,939 A | * | 3/2000 | Agarwala et al. ........... 438/132 |
| 6,166,421 A | | 12/2000 | Kalnitsky et al. |
| 2002/0113291 A1 | * | 8/2002 | Adkisson et al. ............ 257/529 |
| 2005/0029620 A1 | * | 2/2005 | Ueda .......................... 257/529 |

* cited by examiner

*Primary Examiner*—Jerome Jackson
*Assistant Examiner*—Paul A Budd
(74) *Attorney, Agent, or Firm*—Mark B. Bilak (57) ABSTRACT

The present invention provides electrically-programmable fuse structures having radiation inhibitive properties for preventing non-destructive security breaches by radiation imaging techniques such as X-ray imaging, without adversely effecting fuse programmability, and methods of designing the same.

14 Claims, 10 Drawing Sheets

SECURE ELECTRICALLY
PROGRAMMABLE FUSE

CROSS REFERENCE TO RELATED
APPLICATIONS

The present invention is related to commonly-owned, co-pending U.S. patent application Ser. No. 10/904,058 entitled PROGRAMMABLE SEMICONDUCTOR DEVICE, the whole contents and disclosure of which is incorporated by reference as if fully set forth herein.

BACKGROUND OF THE INVENTION

The present invention relates to programmable semiconductor devices, more particularly, to secure electrically programmable fuses (e-fuses) and methods of manufacturing the same.

E-fuses are widely incorporated in circuit designs for a variety of purposes. For example, e-fuses may be incorporated to replace defective cells or circuits, customize a circuit design for a specific application, or encode data such as electronic chip ID or program code. Conventional e-fuse structures are insecure, and as such, the state of one or more fuses may be ascertained by non-destructive radiation imaging techniques such as X-ray imaging. By non-destructively observing the fuse states within a particular circuit design, the state of each e-fuse (e.g. blown or not blown) can be used to breach the security of the design. Known e-fuse states can be used to breach security features of the system since the states can be ascertained without destroying the chip.

Conventional e-fuses take form in a variety of structures. The basic principle of all e-fuses is that an electrically programmable link can be programmed by driving sufficient current through the e-fuse structure, thus raising link temperature until it ruptures. When a sufficient amount of current flows from a first end of the fuse structure, through the fuse link, to a second end of the fuse structure, the fuse link heats up and the resistance of the e-fuse is dramatically changed from a low impedance state to a high impedance state.

Figure 1A:
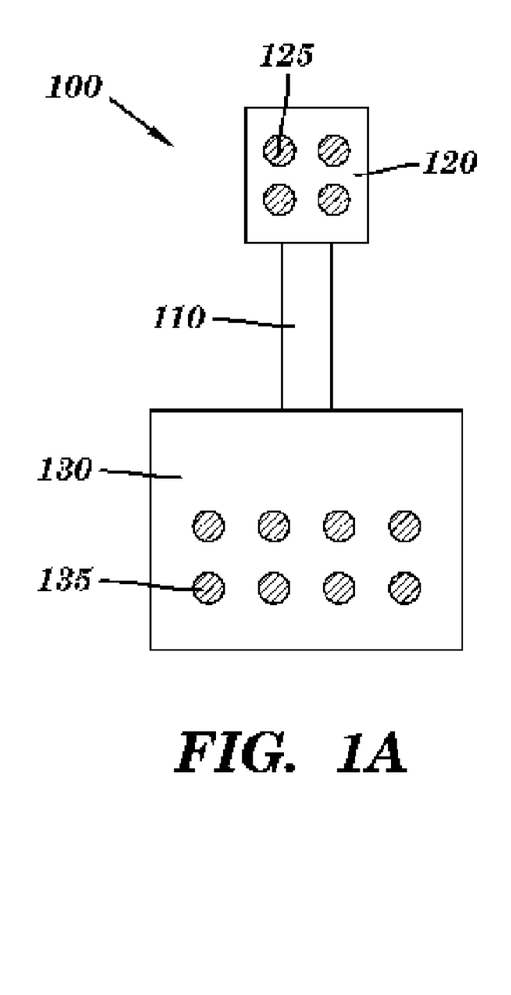
FIG. 1A is a diagram illustrating a conventional e-fuse structure.

A conventional e-fuse structure such as the kind described in commonly-owned, co-pending U.S. patent application Ser. No. 10/904058 entitled PROGRAMMABLE SEMICONDUCTOR DEVICE is now described in accordance with FIGS. 1A and 1B. FIG. 1A illustrates a top-down view of conventional e-fuse structure 100. E-fuse structure 100 comprises fuse link 110 between first end 120 and second end 130. The ends can be symmetric, or alternatively, asymmetric as shown in FIG. 1A, where second end 130 is larger than first end 120. When the ends are asymmetric, the second end is typically referred to as a cathode and the first end as an anode. Reliability of the fuse programming process is improved if the cathode is larger than the anode. Fuse link 110, first end 120 and second end 130 are typically formed from a semiconductor material such as doped polysilicon. The polysilicon can be doped with either n-type or p-type dopants. Optionally, a silicide layer can be formed on the fuse structure to improve the programmability of the fuse. Contacts, such as contacts 125 and 135, are formed on first end 120 and second end 130, respectively, for providing electrically conductive contacts to fuse structure 100.

Figure 1B:
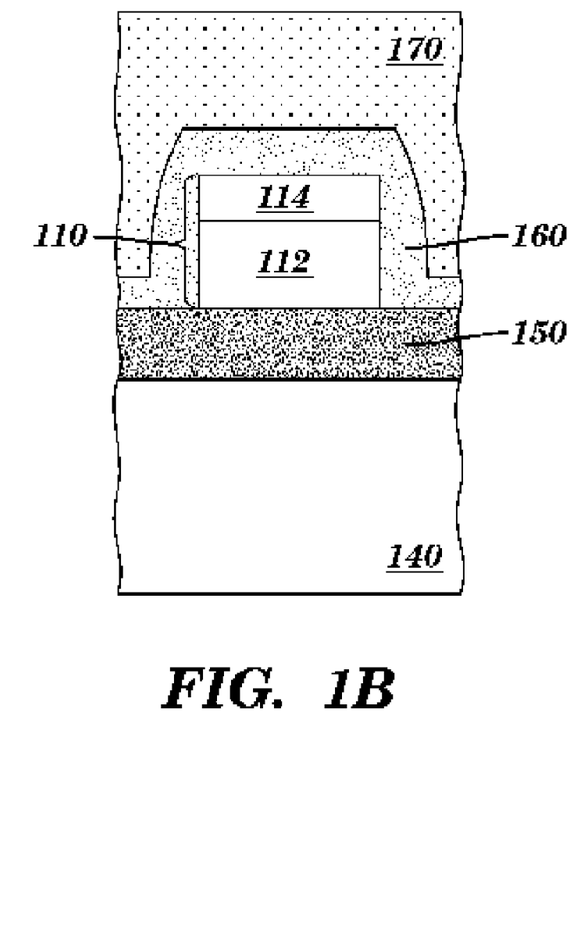
FIG. 1B is a cross-sectional diagram illustrating a conventional e-fuse structure.

FIG. 1B illustrates a cross-sectional view of e-fuse structure 100 of FIG. 1A across the width of fuse link 110. The fuse structure is formed on semiconductor substrate 140. Optionally, insulator layer 150 can be formed on semiconductor substrate 140, and the fuse structure can then be formed on insulator layer 150. Fuse link 110 comprises doped polysilicon layer 112 and optional silicide layer 114. Optional silicide layer 114 forms a low resistance portion of the fuse structure. When current flows through the fuse link, polysilicon layer 112 heats up, assisting in the migration of the silicide toward one end of the fuse. The direction of the migration of suicide depends on the current flow direction. Optional insulator layer 150 improves fuse programmability by trapping heat energy between the fuse structure and the substrate, thus maintaining a high temperature at the polysilicon-silicide junction. Insulator region 170 also improves fuse programmability by trapping heat energy within the fuse structure. Non-reactive silicon nitride layer 160 can be optionally formed over fuse link 110.

Conventionally, metal wiring is permitted over the ends of e-fuse structures (e.g. anodes and cathodes), but is strictly prohibited from being placed over the fuse link region itself. Metal is prohibited over the fuse link region because metal wiring layers, in particular thick metal wires, diminish the programmability of e-fuse structures because the wiring layers act as parasitic heat sinks. If the fuse link region is not maintained at a sufficiently elevated temperature during the programming process, the programmability of the fuse may become unreliable. Metal layers tend to sink heat energy away from the fuse region during programming, thus impacting the reliability of the fuse programming process. If the fuse is not maintained at a sufficient temperature throughout the programming process, the fuse link region may not be fully programmed (i.e. some of the fuse link region may remain intact, thus forming a quasi-conductive path between the ends of the fuse). Insulative materials are conventionally formed both above (e.g. SiN) and below (e.g. $SiO_2$) the fuse structure to help maintain an elevated temperature around the fuse during programming by minimizing heat loss through the semiconductor substrate and metal wiring layers.

U.S. Pat. No. 6,166,421 (the '421 Patent), assigned to National Semiconductor Corporation and incorporated herein by reference in its entirety, discusses an alternative e-fuse structure. FIG. 4B of the '421 Patent illustrates a cross-sectional view of e-fuse 400 before programming. The section of polysilicon layer 412 to be programmed, which is formed under insulator layer 414, is not covered by any metal layers or wiring. FIG. 5A illustrates a cross-sectional view of fuse 400 after it has been programmed. The polysilicon layer has migrated into two separate, distinct sections 412A and 412B. The programmed section of the polysilicon link is the portion of polysilicon layer 412 that was formed under insulator 414 in FIG. 4B, but is no longer present because it has been migrated away from this region into cavities 430 of FIG. 4B. Therefore, the fuse state (i.e. programmed or un-programmed) can be determined by subjecting the fuse structure to radiation imaging techniques. For example, X-rays are produced when high energy particles collide with a target and electron energy loss resulting from the collision is manifested as X-rays. When X-rays encounter any form of matter, they are partly transmitted and partly absorbed. X-ray absorption is measured according to the following formula: $I=I_o exp-(\mu/\rho)(\rho x)$ where I: transmitted beam intensity; $I_o$: incident beam intensity; $\mu/\rho$: mass absorption coefficient; $\rho$: density; x: distance between source (e.g. emitter) and absorber. Because no X-ray inhibitive material is formed over the programmable region of the fuse, the state of each fuse can be readily determined using non-destructive radiation imaging techniques such as X-ray imaging. The e-fuse states can then be used to breach the security of the circuit design because the design has not been destroyed (e.g. deconstructed), and thus, is subject to observation, operation, and/or reverse-engineering.

Therefore, there exists a need for e-fuse structures having radiation inhibiting properties for preventing non-destructive security breaches, such as by X-ray imaging, but without adversely effecting e-fuse programmability.

BRIEF SUMMARY OF THE INVENTION

The present invention addresses the above-described problems by providing electrically-programmable fuse structures having radiation inhibiting properties for preventing non-destructive security breaches, such as by X-ray imaging, without adversely effecting fuse programmability, and methods of designing the same.

In accordance with one aspect of the invention, a programmable device comprises a substrate, an elongated semiconductor material on the substrate, the elongated semiconductor material having a first end, a second end, and a fuse link between the ends, an insulating layer overlying the elongated semiconductor material, and an electrically isolated radiation inhibitive structure positioned over the fuse link and separated from the fuse link by at least 0.2 microns of the insulating layer, the radiation inhibitive structure having an area of at least that of the fuse link.

Furthermore, the radiation inhibitive structure may comprise a single radiation inhibitive layer or multiple radiation inhibitive layers.

In accordance with another aspect of the invention, a programmable device comprises a substrate, an elongated semiconductor material on the substrate, the elongated semiconductor material having a first end, a second end, and a fuse link between the ends, an insulating layer overlying the elongated semiconductor material, an electrically isolated x-ray inhibitive structure positioned over the fuse link and separated from the fuse link by at least 0.2 microns of the insulating layer, the x-ray inhibitive structure having an x-ray absorbance greater than that of the insulating layer, the x-ray inhibitive structure having an area of at least that of the fuse link. Furthermore, the x-ray inhibitive structure has a total thickness of at least 0.35 microns.

According to yet another aspect of the invention, a method of designing a programmable device comprises identifying a fuse link marking layer, the fuse link marking layer corresponding to a fuse link to be formed on a substrate, storing a center point of the fuse link marking layer, storing a length and width of the fuse link marking layer, identifying a metal level to be formed at least 0.2 microns above the fuse link, drawing a shape in the metal level, the shape corresponding to a radiation inhibitive layer to be formed in the metal level, the shape having substantially the same center point as the fuse link marking layer, the shape having an area of at least that of the fuse link marking layer, and storing the center point, width, and length of the shape.

According to another aspect of the invention, a method of designing a programmable device comprises identifying a fuse link marking layer, the fuse link marking layer corresponding to a fuse link to be formed on a substrate, storing a center point of the fuse link marking layer, storing a length and width of the fuse link marking layer, identifying a plurality of metal levels, each metal level to be formed at least 0.2 microns above the fuse link, drawing a plurality of shapes in the metal levels, each shape drawn corresponding to a radiation inhibitive layer to be formed in one of the metal levels, each shape having substantially the same center point as the fuse link marking layer, each shape having an area of at least that of the fuse link marking layer, and storing the center point, width, and length of each shape.

Further and still other aspects of the present invention will become more readily apparent when the following detailed description is taken in conjunction with the accompanying drawing figures.

DETAILED DESCRIPTION OF PREFERRED EMBODIMENTS OF THE INVENTION

The present invention provides radiation inhibitive electronic fuse (e-fuse) structures and methods of designing the same for preventing non-destructive security breaches by radiation imaging techniques such as X-ray imaging.

The radiation inhibitive e-fuse structures of the present invention prevent non-destructive security breaches by inhibiting imaging of the underlying e-fuse structures. Security breaches can be inhibited by decreasing, limiting, absorbing, reflecting, and/or blocking the radiation associated with a particular imaging technique. Radiation emitted from a source can be observed using various imaging techniques, thus resulting in an image of the source. The state of an underlying e-fuse can be secured from various non-destructive imaging techniques by an overlying radiation inhibitive structure. The overlying radiation inhibitive structure prevents non-destructive imaging of the underlying e-fuse structure, thus preventing the state of the e-fuse from being determined (e.g. imaged). For example, imaging techniques such as optical, e-beam, X-ray (e.g. Energy Dispersive X-ray Spectroscopy (EDS or EDX) or X-ray analysis), laser, Transmission Electron Microscopy (TEM), Scanning Electron Microscopy (SEM), Scanning Ion, Emission Microscopy, electron and optical-beam induced current thermal beam imaging, and the like can be rendered ineffective by a radiation inhibitive structure having the appropriate dimensions. Radiation imaging techniques such as the one previously mentioned are rendered ineffective so long as a sufficient amount of the incident radiation is inhibited (e.g. decreased, limited, absorbed, reflected, and/or blocked) by a radiation inhibitive structure such that the state of an underlying e-fuse can not be determined (e.g. imaged).

For illustrative purposes only, the present invention is next described in detail with respect to non-destructive X-ray imaging techniques. It will be understood by those skilled in the art that other radiation imaging techniques, such as the ones previously mentioned, can be inhibited by the radiation inhibitive e-fuse structures of the present invention.

Figure 2:
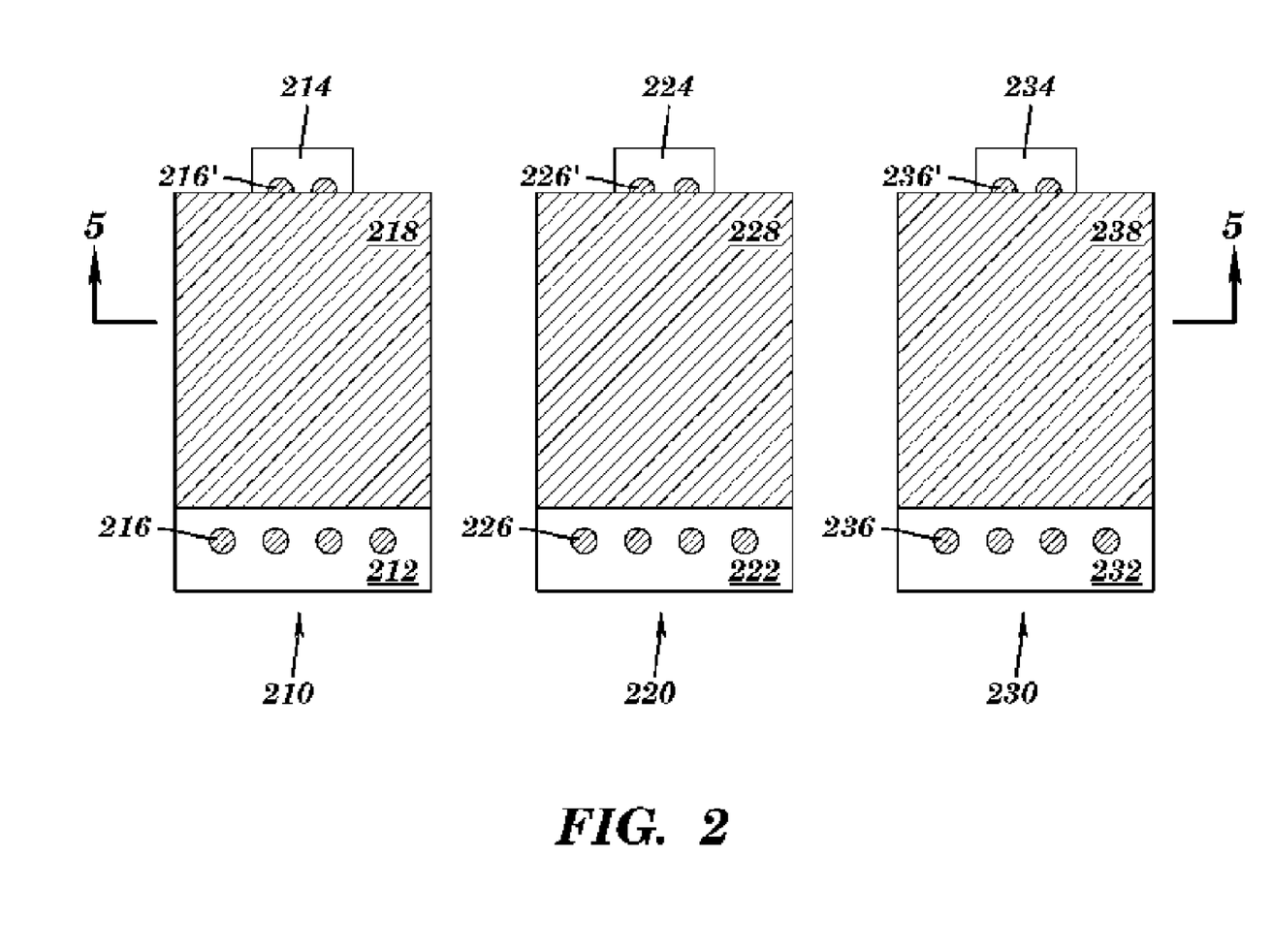
FIG. 2 is a diagram illustrating an X-ray inhibitive e-fuse structure according to an embodiment of the present invention.

FIG. 2 illustrates a top-down view of exemplary X-ray inhibitive electronic fuse structures according to one embodiment of the present invention. X-ray inhibitive electronic fuse structures 210, 220, and 230 each comprise an electrically programmable fuse (e-fuse) and an X-ray inhibitive layer overlaying a section of the underlying e-fuse. The X-ray inhibitive layer minimizes the contrast associated with the e-fuse structures during X-ray imaging techniques by inhibiting (e.g. decreasing, limiting, absorbing, reflecting, and/or blocking) a sufficient amount of the X-ray radiation emitted from the e-fuse structures and/or from the X-ray imaging source such that the state of the underlying e-fuse can not be determined (e.g. imaged). The underlying e-fuses can be any suitable e-fuse structure such as the kinds previously described. For example, the underlying e-fuses can be of the kind illustrated in FIGS. 1A and 1B.

E-fuse 210 comprises a first end 212 (partially shown), a second end 214 (partially shown), and a fuse link (not shown) interposed between the first and second ends. First end 212 and second end 214 can be symmetric or asymmetric as previously described. The e-fuse can comprise any suitable semiconductor material such as polysilicon, doped polysilicon, amorphous silicon, epitaxial silicon, silicon germanium alloy in any phase, or the like. Furthermore, a silicide layer can be formed on the semiconductor material to improve the programming characteristics of the fuse as previously described. The silicide layer, or silicide-germanide alloy layer, can comprise any suitable metal such as tungsten, cobalt, titanium, tantalum, nickel, or the like. Conductive contacts such as contacts 216 and 216' can be formed on both ends of e-fuse 210 to form conductive connections between the e-fuse and other components such as wiring layers or circuits.

E-fuse 220 comprises a first end 222 (partially shown), a second end 224 (partially shown), and a fuse link (not shown) interposed between the first and second ends. Conductive contacts such as contacts 226 and 226' can be formed on both ends of e-fuse 220 to form conductive connections between the e-fuse and other components. E-fuse 230 comprises a first end 232 (partially shown), a second end 234 (partially shown), and a fuse link (not shown) interposed between the first and second ends. Conductive contacts such as contacts 236 and 236' can be formed on both ends of e-fuse 230 to form conductive connections between the e-fuse and other components. E-fuses 220 and 230 can be formed according to the same geometric considerations as e-fuse 210 and can comprise the same materials as e-fuse 210, both as previously described.

An X-ray inhibitive layer is intentionally placed over each e-fuse to inhibit a sufficient amount of X-ray radiation from being observed, or imaged, as previously described. By inhibiting a sufficient amount of the X-ray radiation, the X-ray inhibitive layer prevents non-destructive detection of the state of the e-fuses by X-ray imaging techniques. For example, X-ray inhibitive layer 218 is positioned over e-fuse 210, X-ray inhibitive layer 228 is positioned over e-fuse 220, and X-ray inhibitive layer 238 is positioned over e-fuse 230. An insulating layer (not shown) separates the e-fuses from the X-ray inhibitive layers. The radiation inhibitive layer of the present invention can comprise any element or compound that comprises one or more high atomic number elements suitable for inhibiting radiation. For example, the exemplary X-ray inhibitive layer preferably comprises a metal such as Cu, Al, Ti, Tantalum, or the like. Cu, Al, Ti, Tantalum are preferred over other metals because they effectively absorb X-ray radiation and are compatible with standard CMOS processing. Most preferably, the exemplary X-ray inhibitive layer comprises Cu. Alternatively, the X-ray inhibitive layer can comprise rare earth metal compounds such as Gadolinium Oxide, Hafnium Oxide, Gadolinium Oxy-sulfide, Cesium Iodide, or the like.

The dimensions and placement of each radiation inhibitive layer are critical aspects of the present invention. Random dimensions and/or placement of a radiation inhibitive layer in the vicinity of an e-fuse most likely will not provide sufficient security from non-destructive imaging techniques and may also negatively impact the programmability of the underlying e-fuses. As illustrated in FIG. 2, X-ray inhibitive layers 218, 228, and 238 have at least the same area as the fuse link portion of e-fuses 210, 220, and 230, respectively. For example, for a rectangular fuse link, the overlying radiation inhibitive layer should have at least the same length and width as that of the underlying fuse link. For illustrative purposes only, the width of each radiation inhibitive layer can be substantially the same as that of the first end of each e-fuse. For example, X-ray inhibitive layer 218 has the same width as first end 212 of e-fuse 210. If an X-ray inhibitive layer does not have an area of at least that of the underlying fuse link, a portion of the fuse link region remains exposed, and thus, the state of the fuse link may be determined by non-destructive X-ray imaging techniques.

However, the dimensions of the radiation inhibitive layer should not be so much greater than those of the fuse link such that the radiation inhibitive layer adversely sinks an unacceptable amount of heat energy away from the e-fuse region during programming. If an unacceptable amount of heat is diverted from the e-fuse to the radiation inhibitive layer during programming, the e-fuse may not be programmed reliably as previously described. Therefore, the radiation inhibitive layer should be floating, or in other words, electrically isolated from any other components (e.g. circuits) or structures (e.g. wiring layers). If the radiation inhibitive layer is connected or coupled to any other heat-sinking material such as a metal wiring layer, the heat sinking capacity of the coupled structure will negatively interfere with e-fuse programming. Preferably, for X-ray imaging techniques, the X-ray inhibitive layer is of sufficient dimensions to absorb enough X-ray radiation to prevent X-ray imaging of the underlying e-fuse, while sinking a minimal, or at least an acceptable, amount of heat energy.

Figure 3A:
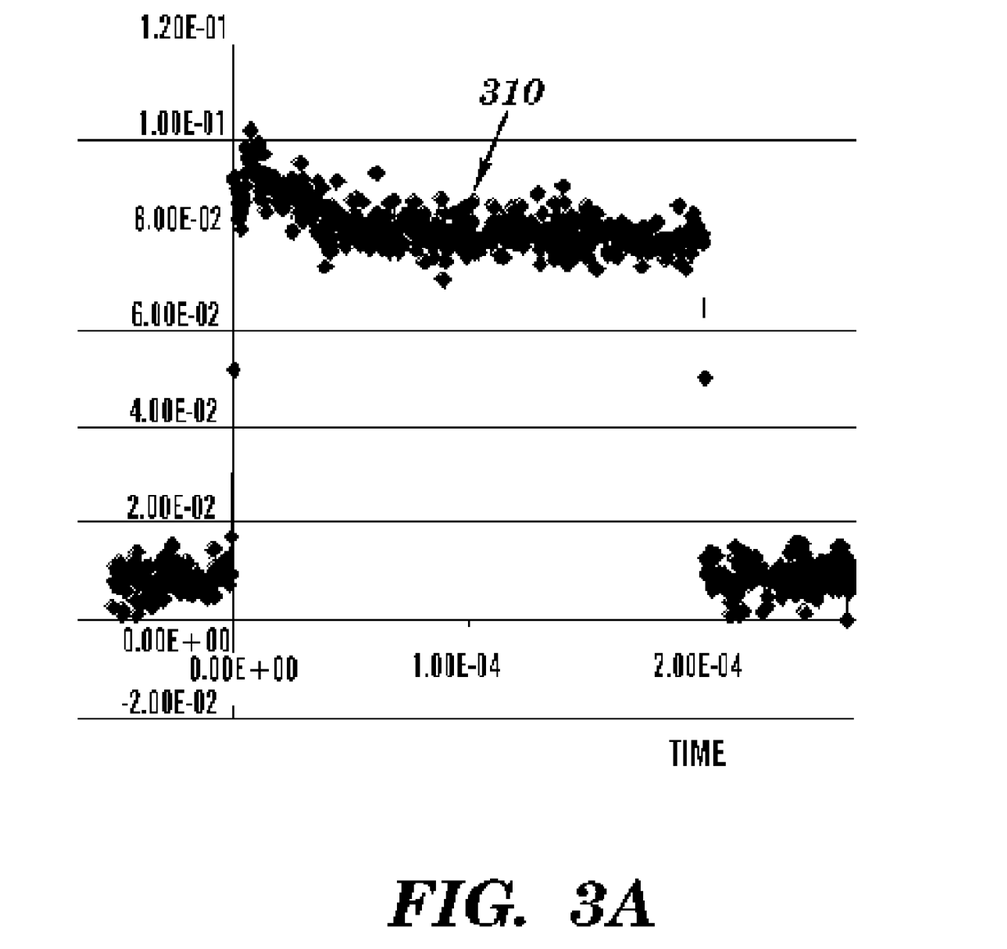
FIG. 3A is a plot of a reliable e-fuse programming current.
Figure 3B:
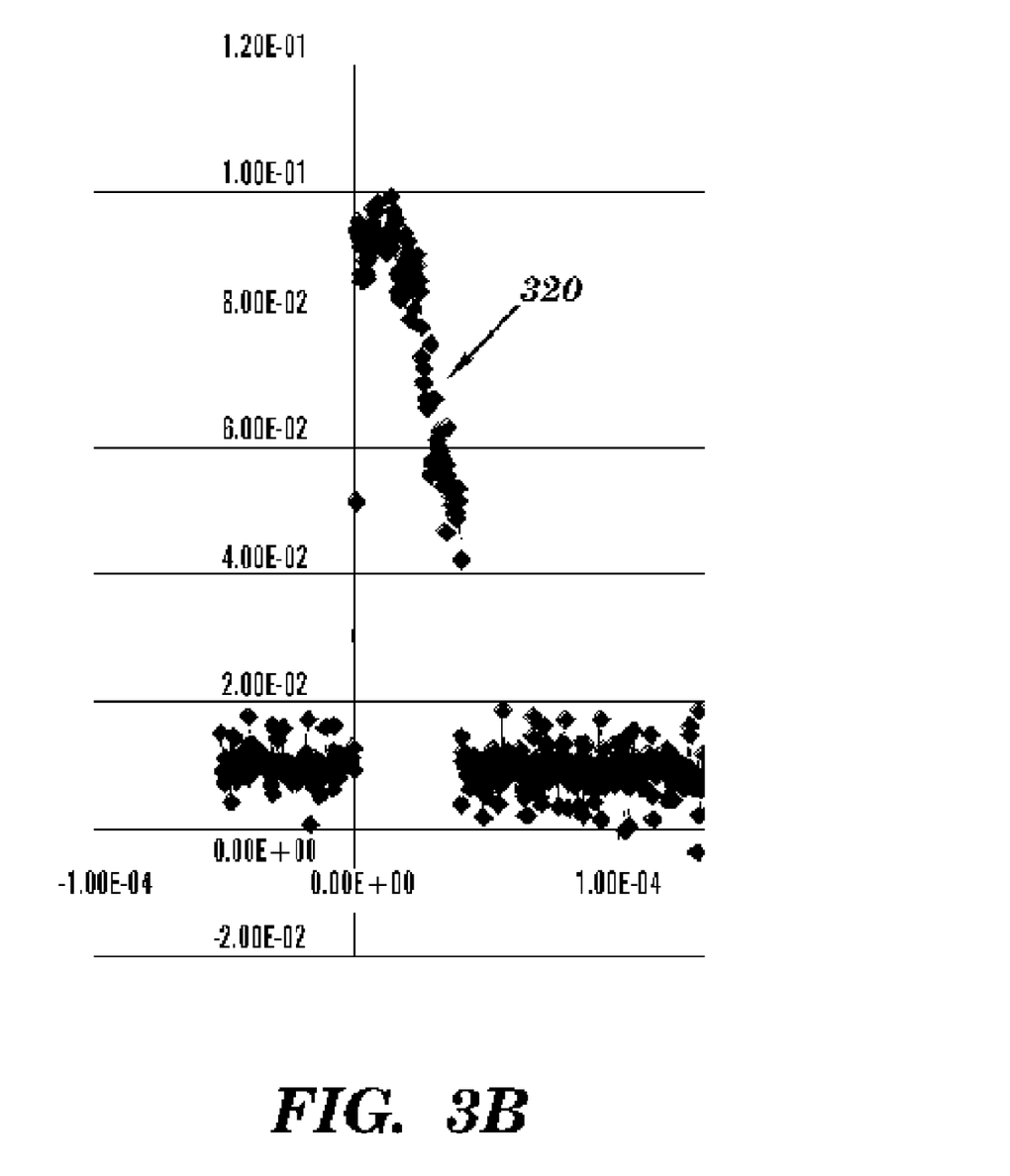
FIG. 3B is a plot of an un-reliable e-fuse programming current.

Conventional e-fuses such as the kind illustrated in FIGS. 1A and 1B must be maintained at an elevated temperature during programming to ensure that a sufficient programming current flows though the fuse link region during the entire programming period. A sufficient programming current is necessary to ensure that the fuse link region is reliably migrated from a low resistance "un-programmed" state to a higher resistance "programmed" state during programming. For example, FIG. 3A illustrates programming current 310 for a conventional e-fuse structure of the kind illustrated in FIGS. 1A and 1B. Because programming current 310 remains sufficiently elevated during the entire programming period (200 µs), the e-fuse is programmed properly as described previously. FIG. 3B illustrates a programming current that does not remain sufficiently elevated during the entire programming period. Here, programming current 320 becomes negligible after approximately the first 50 µs of the 200 µs programming period. The e-fuse structure associated with the programming current illustrated in FIG. 3B is a conventional e-fuse structure having an additional Cu metal layer positioned over the e-fuse and separated from the e-fuse by less than 0.2 microns (μ) of insulative material. The Cu metal layer absorbed an unacceptable amount of heat energy away from the e-fuse during programming such that programming current 320 dropped substantially after approximately only 50 μs. The programming current dropped substantially after approximately 50 μs because the temperature of the e-fuse structure was not maintained sufficiently high enough due to the heat sinking characteristics of the overlying metal structure. Thus, the current-carrying capability of the e-fuse structure was diminished as the e-fuse temperature dropped. Insufficient programming currents like the kind illustrated in FIG. 3B result in unreliably programmed e-fuses. Thus, when an X-ray inhibitive layer comprises Cu, it should be positioned at least 0.2 μ above the e-fuse and separated by a sufficient insulator such as $SiO_2$ so as to not inhibit programming of the underlying e-fuses as previously described.

Figure 4A:
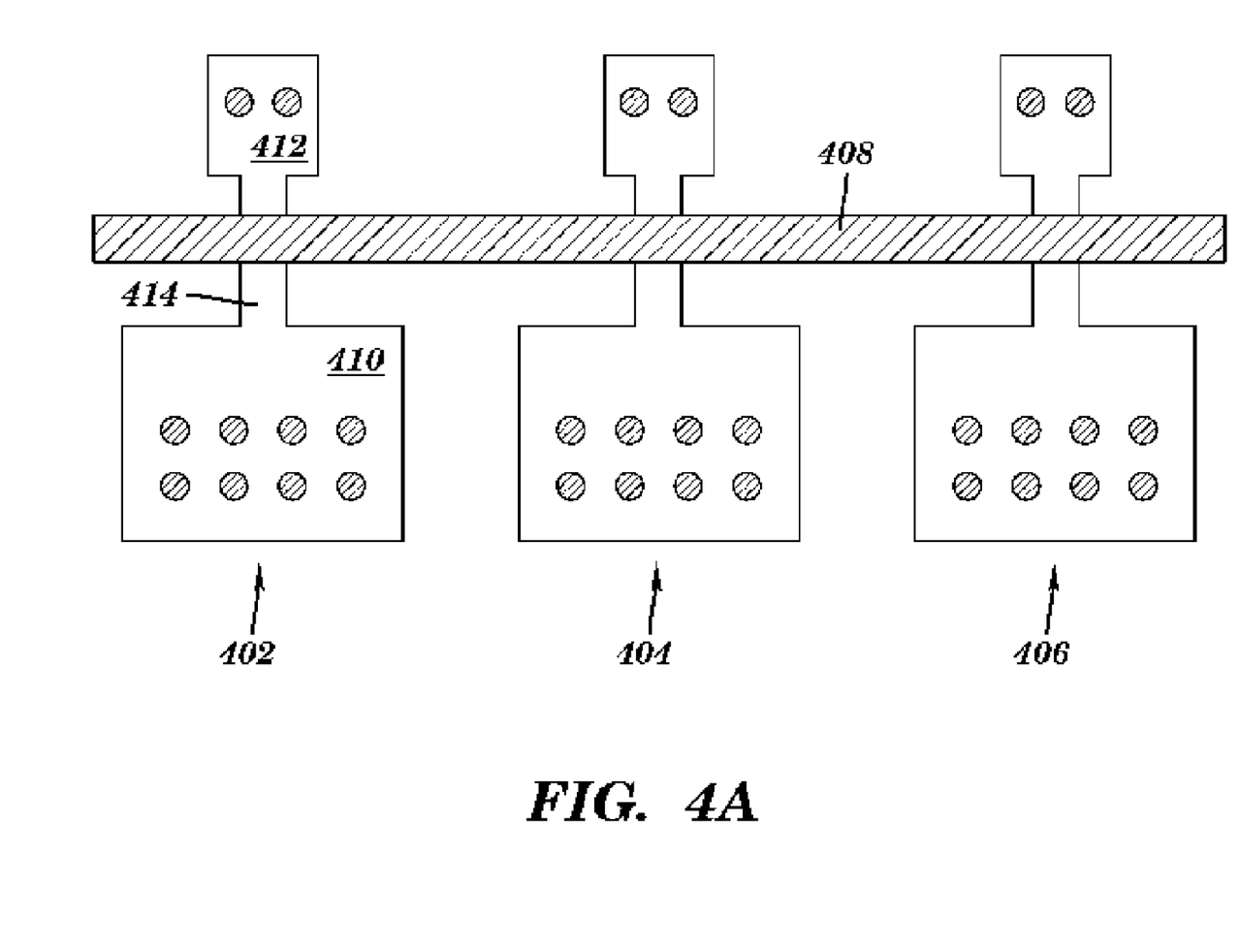
FIG. 4A is a diagram of an exemplary ineffective X-ray inhibitive e-fuse structure.

FIG. 4A illustrates an exemplary ineffective X-ray inhibitive e-fuse structure. The structure comprises e-fuses 402, 404, and 406 and an overlying metal layer 408. Each e-fuse has a first end, a second end, and a fuse link. For example, e-fuse 402 has first end 410, second end 412, and fuse link 414. Metal layer 408 is separated from the e-fuses by an insulating layer (not shown). Each fuse link is only partially covered by metal layer 408. Metal layer 408 is insufficient for inhibiting non-destructive X-ray imaging of the e-fuses because the metal layer only partially covers each fuse link, leaving some portion of each fuse link exposed to X-ray imaging techniques.

Figure 4B:
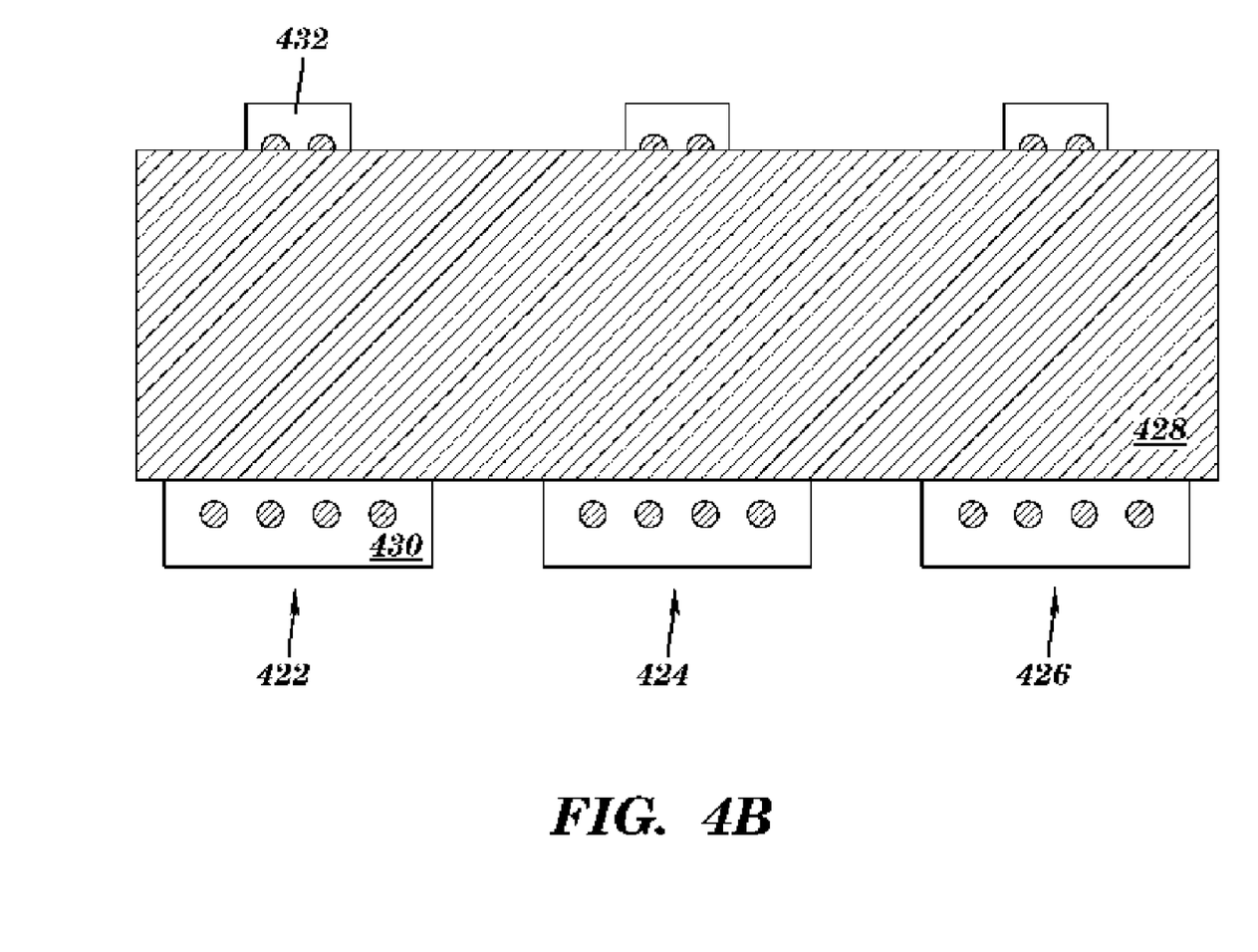
FIG. 4B is a diagram of another exemplary ineffective X-ray inhibitive e-fuse structure.

FIG. 4B illustrates another exemplary ineffective X-ray inhibitive e-fuse structure. The structure comprises e-fuses 422, 424, and 426 and an overlying metal layer 428. Each e-fuse has a first end, a second end, and a fuse link. For example, e-fuse 422 has first end 430 (partially shown), second end 432 (partially shown), and a fuse link (not shown). Metal layer 428 is separated from the e-fuses by an insulating layer (not shown). Each fuse link is completely covered by metal layer 428. However, metal layer 428 is too large, and thus will absorb an unacceptable amount of heat energy away from underlying e-fuses during programming. Therefore, the underlying e-fuses will not be programmed reliably as previously discussed.

Figure 4C:
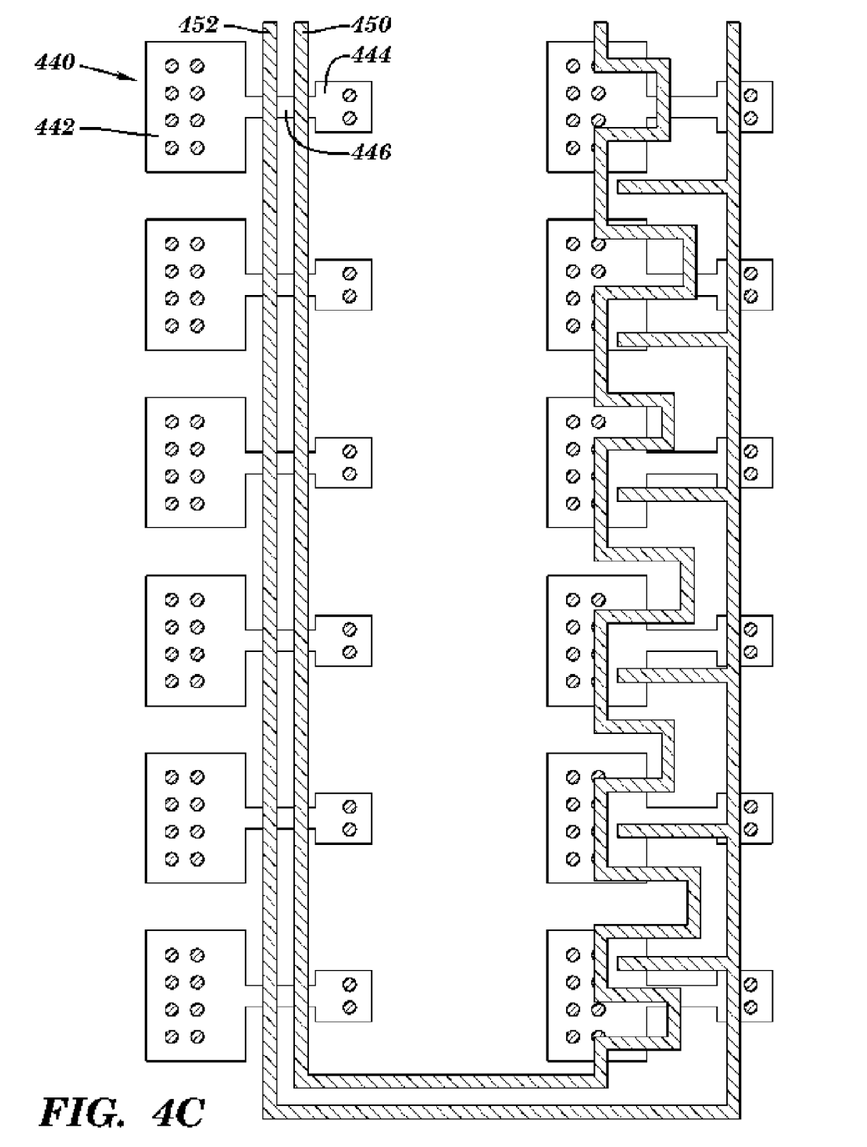
FIG. 4C is a diagram of yet another exemplary ineffective X-ray inhibitive e-fuse structure.

FIG. 4C illustrates yet another exemplary ineffective X-ray inhibitive e-fuse structure. The structure comprises a plurality of e-fuses such as e-fuse 440. Each e-fuse has a first end, a second end, and a fuse link. For example, e-fuse 440 has first end 442, second end 444, and fuse link 446. First metal layer 450 and second metal layer 452 are randomly formed over the plurality of e-fuses, where an insulating layer (not shown) separates the random metal layers from the plurality of e-fuses. Each fuse link is only partially covered, at best, by the random metal layers. First metal layer 450 and second metal layer 452 are insufficient for inhibiting non-destructive X-ray imaging of the fuses because the random metal layers only partially cover the fuse links, leaving some portion of the fuse links exposed to X-ray imaging techniques. Additionally, the random metal layers may be too large, and thus will absorb an unacceptable amount of heat energy away from underlying e-fuses during programming. Therefore, the underlying e-fuses may not be programmed reliably as previously discussed.

The structures illustrated in FIGS. 4A-4C re-emphasize that both the dimensions and placement of the radiation inhibitive layer are critical aspects of this invention. If the radiation inhibitive layer is not deliberately sized and placed appropriately, it may not achieve the desired result of securing e-fuse states from non-destructive imaging techniques or may adversely affect e-fuse programming, or both.

Figure 5:
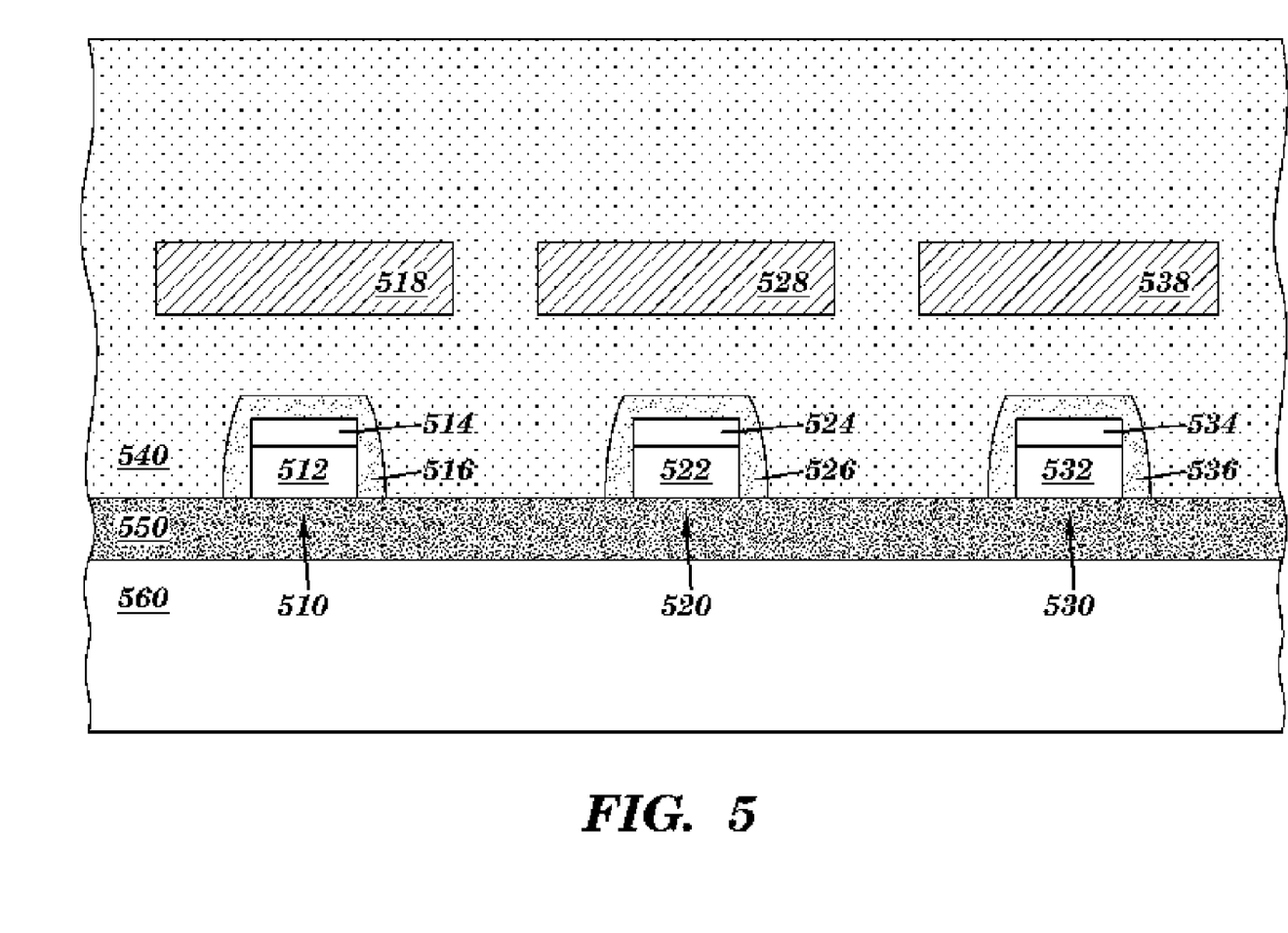
FIG. 5 is a cross-sectional diagram illustrating an X-ray inhibitive e-fuse structure according to an embodiment of the present invention.

FIG. 5 illustrates a cross-sectional view of the exemplary X-ray inhibitive e-fuse structures illustrated in FIG. 2 along line 5. X-ray inhibitive e-fuse structures 510, 520, and 530 each comprise an e-fuse and an X-ray inhibitive layer positioned over a section of each underlying e-fuse. For example, X-ray inhibitive e-fuse structure 510 comprises an e-fuse formed by semiconductor layer 512, optional silicide layer 514, and optional non-reactive silicon nitride layer 516, and X-ray inhibitive layer 518. X-ray inhibitive e-fuse structure 520 comprises an e-fuse formed by semiconductor layer 522, optional silicide layer 524, and optional non-reactive silicon nitride layer 526, and X-ray inhibitive layer 528. X-ray inhibitive e-fuse structure 530 comprises an e-fuse formed by semiconductor layer 532, optional silicide layer 534, and optional non-reactive silicon nitride layer 536, and X-ray inhibitive layer 538. The semiconductor region of each e-fuse can comprise any suitable semiconductor material such as polysilicon, doped polysilicon, amorphous silicon, epitaxial silicon, silicon germanium alloy in any phase, or the like. The silicide region or silicide-germanide alloy region of each e-fuse can comprise any suitable metal such as tungsten, cobalt, titanium, tantalum, nickel, or the like. Each X-ray inhibitive layer can comprise any element or compound that comprises one or more high atomic number elements suitable for inhibiting X-ray radiation. Preferably, the X-ray inhibitive layer comprises a metal such as Cu, Al, Ti, Tantalum, or the like. Cu, Al, Ti, Tantalum are preferred over other metals because they effectively absorb X-ray radiation and are compatible with standard CMOS processing. Most preferably, the X-ray inhibitive layer comprises Cu. Alternatively, the X-ray inhibitive layer can comprise rare earth metal compounds such as Gadolinium Oxide, Hafnium Oxide, Gadolinium Oxy-sulfide, Cesium Iodide, or the like.

X-ray absorbance of the X-ray inhibitive layer, measured by $I=I_o exp-(\mu/\rho)(\rho x)$, should be larger than that of the surrounding insulator so that no significant X-ray contrast can be observed when the e-fuse structure is exposed to X-ray imaging techniques. X-ray absorbance is a function of the mass absorption coefficient ($\mu/\rho$) of the absorbing material, the thickness of the absorbing material, and the energy and wavelength of the emitter (e.g. source). The inventors have determined that X-ray inhibitive layers comprising Cu should have a total thickness of at least 0.35 μ to sufficiently suppress e-fuse X-ray contrast. In general, this minimum thickness can be larger or smaller depending upon the material used for the radiation inhibitive layer and the emitter characteristics (e.g. energy, wavelength, etc.).

X-ray inhibitive layers 518, 528, and 538 are positioned over the e-fuses. Each X-ray inhibitive layer has an area of at least that of the fuse link regions as previously described. Additionally, insulating layer 540, preferably $SiO_2$, is interposed between the e-fuses and the X-ray inhibitive layers. Insulating layer 540 minimizes heat loss during e-fuse programming by trapping heat energy generated by the e-fuses as previously described. The inventors have determined that each X-ray inhibitive layer should be separated from the e-fuses by at least 0.2 μ of insulator material when the insulator is $SiO_2$ and the X-ray inhibitive layers are formed from Cu. This minimum separation can be greater or smaller depending upon the insulator material composition, the X-ray inhibitive layer material, and the e-fuse structure. Optionally, the e-fuses are formed on insulator layer 550. Optional insulator layer 550, preferably comprising $SiO_2$, also helps to trap the heat energy generated during fuse programming from being dissipated by semiconductor substrate 560. Semiconductor substrate 560 can comprise any suitable semiconductor material such as bulk silicon, silicon-on-insulator ("SOI"), SiGe, GaAs, or the like.

Figure 6:
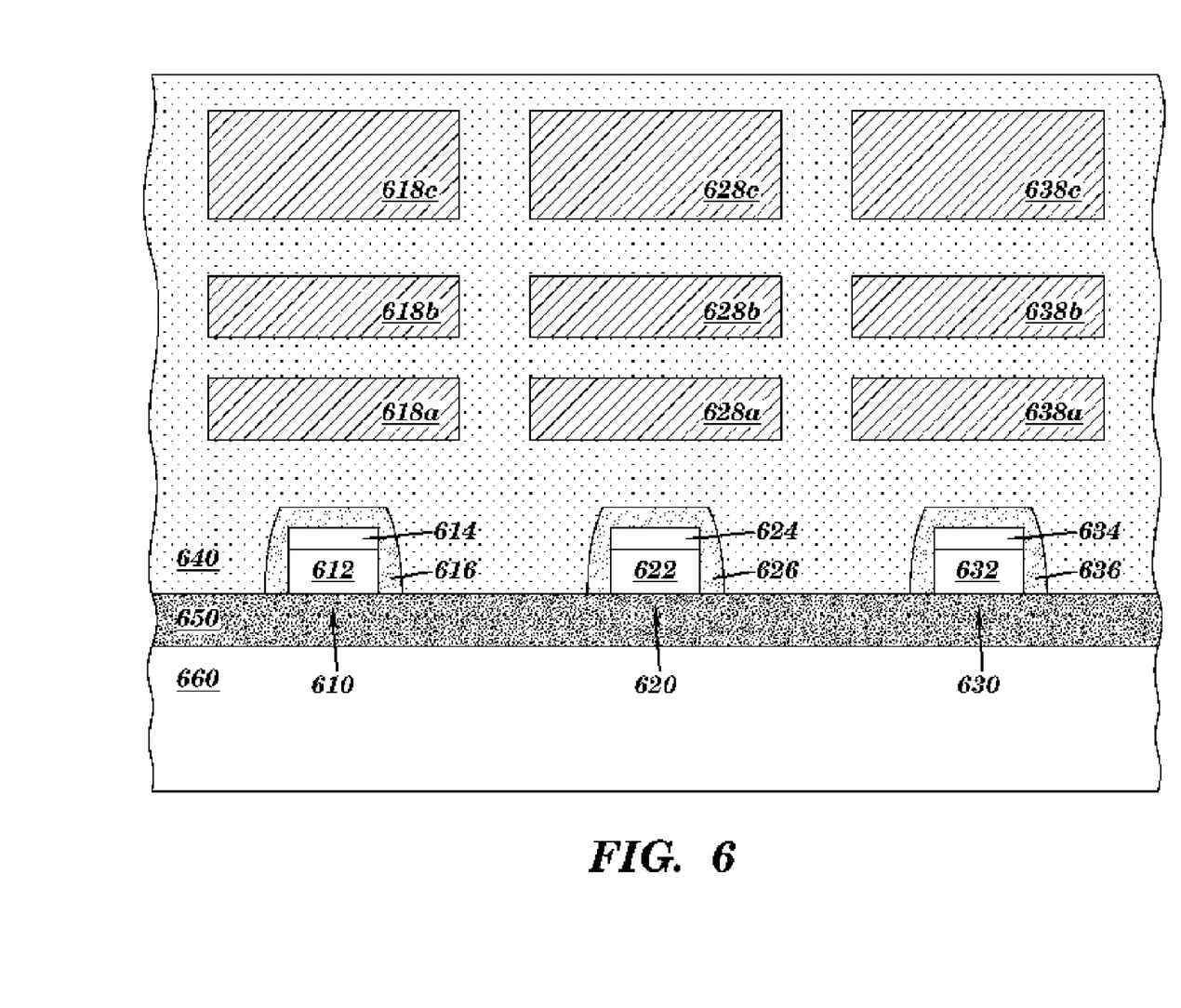
FIG. 6 is a cross-sectional diagram illustrating an X-ray inhibitive e-fuse structure according to another embodiment of the present invention.

FIG. 6 illustrates a cross-sectional view of exemplary X-ray inhibitive e-fuse structures according to another embodiment of the present invention. X-ray inhibitive e-fuse structures 610, 620, and 630 each comprise an e-fuse and multiple X-ray inhibitive layers overlying a section of the underlying e-fuse. Multiple levels of X-ray inhibitive layers are stacked above each e-fuse, each X-ray inhibitive layer being electrically isolated from the other layers in a particular stack and from the underlying e-fuses. All X-ray inhibitive layers in a particular stack are floating as previously described. For example, X-ray inhibitive e-fuse structure 610 comprises an e-fuse formed by semiconductor layer 612, optional silicide layer 614, and optional non-reactive silicon nitride layer 616, and X-ray inhibitive layers 618a, 618b, and 618c. X-ray inhibitive e-fuse structure 620 comprises an e-fuse formed by semiconductor layer 622, optional silicide layer 624, and optional non-reactive silicon nitride layer 626, and X-ray inhibitive layers 628a, 628b, and 628c. X-ray inhibitive e-fuse structure 630 comprises an e-fuse formed by semiconductor layer 632, optional silicide layer 634, and optional non-reactive silicon nitride layer 636, and X-ray inhibitive layers 638a, 638b, and 638c. Insulating layer 640 isolates both vertically and horizontally adjacent X-ray inhibitive layers and also isolates the X-ray inhibitive layers from the underlying e-fuses. Optionally, the e-fuses are formed on insulator layer 650, which in turn, is formed on semiconductor substrate 660. The semiconductor layer, silicide region, X-ray inhibitive layers, insulator layers, and semiconductor substrate can comprise any suitable materials such as the ones previously described.

As described previously, the inventors have determined that X-ray inhibitive layers comprising Cu should have a total thickness of at least 0.35 μ to sufficiently suppress e-fuse X-ray contrast. This requires that the total thickness of all X-ray inhibitive layers stacked over a particular e-fuse be at least 0.35 μ when the layers are formed of Cu. For example, the combined thickness of X-ray inhibitive layers 618a, 618b, and 618c should be at least 0.35 μ. The total thickness does not include the thickness of the insulating materials interposed between multiple layers of X-ray inhibitive material. By stacking multiple radiation inhibitive layers above a particular e-fuse as previously described, the layer closest to the e-fuse can be thin to minimize parasitic heat dissipation, since heat energy generated by the e-fuse during programming will reach this layer first. For example, X-ray inhibitive layers 618a, 628a, and 638a can be thinner than layers 518, 528, and 538 of FIG. 5, respectively, because the X-ray inhibitive structures illustrated in FIG. 6 have multiple X-ray inhibitive layers stacked over a particular e-fuse for absorbing X-rays, which is not the case in FIG. 5. Thus, parasitic heat dissipation can be minimized while sufficiently suppressing e-fuse X-ray contrast by positioning multiple, isolated X-ray inhibitive layers over the e-fuses. As described previously, the minimum total thickness can be larger or smaller depending upon the material used for the radiation inhibitive layer and the emitter characteristics (e.g. energy, wavelength, etc.). Therefore, the radiation inhibitive structure positioned over a particular e-fuse to form the radiation inhibitive e-fuse structure of the present invention can comprise one radiation inhibitive layer as previously described and in accordance with FIG. 5 or can comprise multiple radiation inhibitive layers stacked over the e-fuse and separated by insulative material as previously described and in accordance with FIG. 6.

Figure 7:
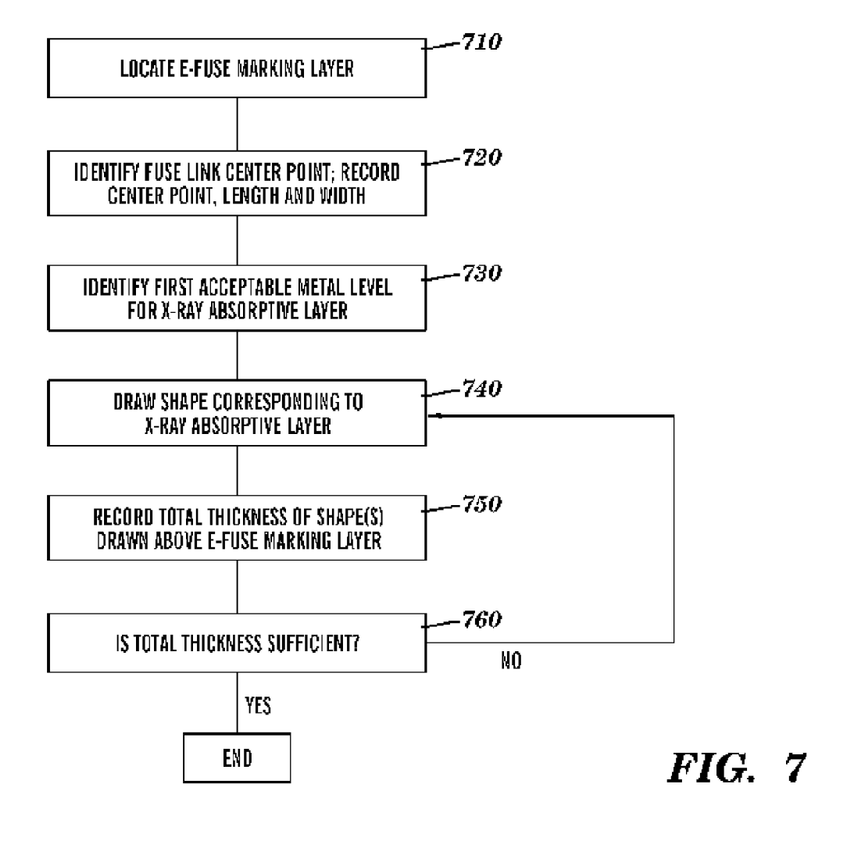
FIG. 7 is a diagram illustrating an exemplary method of designing an X-ray inhibitive e-fuse structure according to an embodiment of the present invention.

FIG. 7 illustrates an exemplary method of designing a radiation inhibitive e-fuse structure according to an embodiment of the present invention. An e-fuse marking layer is located at step 710, where the marking layer corresponds to the location, or coordinates, at which a particular e-fuse structure is to be formed (e.g. fabricated) on a substrate during subsequent processing. The e-fuse marking layer comprises marking layers that correspond to the first and second ends of the e-fuse and the fuse link between the two ends. The fuse link marking layer corresponds to the location, or coordinates, at which the fuse link is to be formed during subsequent processing. At step 720, the center point associated with the located fuse link marking layer is stored along with the length and width of the fuse link marking layer. At step 730, the process identifies the first metal level at which the e-fuse, when fabricated, will be separated by a sufficient distance from the metal level such that the radiation inhibitive layer to be formed in the metal level during subsequent processing will not dissipate an unacceptable amount of heat energy from the underlying e-fuse during programming as previously described. For example, the first metal level in which an X-ray inhibitive layer can be formed should be at least 0.2 μ above the e-fuse structure when the metal is to be formed of Cu and the inter-level dielectric is to be formed of $SiO_2$. At step 740, a shape is drawn that corresponds to a radiation inhibitive layer to be formed above the fuse link marking layer identified in step 710. The shape drawn should have substantially the same center point as the fuse link marking layer to which it is associated, the fuse link center point being stored at step 720. The shape drawn should have an area of at least that of the fuse link marking layer to which it is associated, the fuse link dimensions also being stored at step 720. For a rectangular fuse link marking layer, the shape preferably has a length of at least 0.4 μ and a width of at least 1.5 μ greater than the fuse link marking layer to which the shape is associated. At step 750, the total thicknesses of the shapes drawn above each particular e-fuse marking layer is stored. At step 760, if the total thickness of the shapes drawn above a particular e-fuse marking layer is not sufficient to inhibit a particular radiation imaging technique as previously described when the radiation inhibitive layers are subsequently fabricated, another shape is added to the stack at step 740, where a stack can comprise one or more shapes, each shape drawn in a particular metal level as previously described in accordance with step 740. Shapes are added to a particular stack until radiation imaging of the e-fuse structure will be sufficiently inhibited when the e-fuse structure is fabricated. For example, if the imaging technique uses X-ray radiation and the total X-ray absorbance associated with a particular stack of shapes is less than that of the surrounding insulator to be subsequently fabricated, another shape is added to the stack at step 740, each shape corresponding to a unique X-ray inhibitive layer and having an X-ray absorbance associated with it. Otherwise, significant X-ray contrast may be observed from the e-fuse structure when the e-fuse is exposed to X-ray imaging techniques. As described previously, the inventors have determined that X-ray inhibitive layers comprising Cu should have a total thickness of at least 0.35 μ to sufficiently suppress e-fuse X-ray contrast. Additional shapes corresponding to additional X-ray inhibitive layers are drawn above the e-fuse marking layer, each shape in the stack being drawn in a separate metal level, until the total thickness of the stack is sufficient as previously described.

The radiation inhibitive e-fuse embodiments of the present invention can be incorporated into fuse arrays or circuits such as programmable circuits. For example, the radiation inhibitive e-fuse embodiments of the present invention can be incorporated into a fuse array where a radiation inhibitive e-fuse structure according to the present invention is formed at the intersection of each column and row line of the fuse array. A particular fuse can be programmed and/or sensed by selecting the appropriate row and column of the fuse array. In another example, the radiation inhibitive e-fuse embodiments of the present invention can be incorporated into Programmable Read Only Memory (PROM) circuits. A PROM can be programmed once after its manufacture. In one type of PROM, an array of memory cells can be programmed by opening or "blowing" one or more fuse links. A fuse link is programmed by driving sufficient current through the fuse link until the fuse link breaks, or opens. Alternatively, the radiation inhibitive e-fuse embodiments of the present invention can be incorporated into any suitable integrated circuit requiring programmable fuses. For example, the radiation inhibitive e-fuse embodiments of the present invention can be incorporated into integrated circuits to perform a number of functions such as: forming alterable circuit connections; replacing defective circuit elements with redundant circuit elements; activating security features; or forming a once-programmable memory circuit.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A programmable device, comprising:
a substrate;
an elongated semiconductor material on the substrate, the elongated semiconductor material having a first end, a second end, and a fuse link between the ends;
an insulating layer overlying the elongated semiconductor material;
a silicide layer deposited on an upper surface of the elongated semiconductor material; and
an electrically isolated radiation inhibitive structure positioned over the fuse link and separated from the fuse link by at least 0.2 microns of the insulating layer, the radiation inhibitive structure having an area of at least that of the fuse link.

2. The programmable device of claim 1, further comprising a second insulating layer interposed between the substrate and the elongated semiconductor material.

3. The programmable device of claim 1, further comprising a non-reactive insulating layer deposited on the silicide layer.

4. The programmable device of claim 3, wherein the non-reactive insulating layer comprises silicon nitride.

5. The programmable device of claim 1, wherein the elongated semiconductor material comprises a material selected from the group consisting of: polysilicon, doped polysilicon, amorphous silicon, epitaxial silicon, and silicon germanium alloy.

6. The programmable device of claim 1, wherein the radiation inhibitive structure comprises a plurality of radiation inhibitive layers having an insulating layer deposited between each radiation inhibitive layer.

7. The programmable device of claim 6, wherein the radiation inhibitive layers comprise a material selected from the group consisting of:
metals, copper, aluminum, titanium, tantalum, rare earth metal compounds, gadolinium oxide, hafnium oxide, gadolinium oxy-sulfide, and cesium iodide.

8. The programmable device of claim 1, wherein the radiation inhibitive structure comprises a single radiation inhibitive layer.

9. The programmable device of claim 8, wherein the radiation inhibitive layer comprises a material selected from the group consisting of:
metals, copper, aluminum, titanium, tantalum, rare earth metal compounds, gadolinium oxide, hafnium oxide, gadolinium oxy-sulfide, and cesium iodide.

10. The programmable device of claim 1, wherein the substrate comprises a material selected from the group consisting of: silicon, silicon-on-insulator, SiGe, and GaAs.

11. The programmable device of claim 1, wherein the radiation inhibitive structure has an x-ray absorbance greater than that of the insulating layer.

12. A programmable device, comprising:
a substrate;
an elongated semiconductor material on the substrate, the elongated semiconductor material having a first end, a second end, and a fuse link between the ends;
an insulating layer overlying the elongated semiconductor material; and
an electrically isolated x-ray inhibitive structure positioned over the fuse link separated from the fuse link by at least 0.2 microns of the insulating layer, the x-ray inhibitive structure having an x-ray absorbance greater than that of the insulating layer, the x-ray inhibitive structure having an area of at least that of the fuse link, and the radiation inhibitive structure having a total thickness of at least 0.35 microns.

13. The programmable device of claim 12, wherein the x-ray inhibitive structure comprises at least one radiation inhibitive layer.

14. The programmable device of claim 12, wherein a width of the x-ray inhibitive structure is at least 1.5 microns greater than a width of the fuse link and a length of the x-ray inhibitive structure is at least 0.4 microns greater than a length of the fuse link.

* * * * *